(12) United States Patent
Son et al.

(10) Patent No.: US 11,699,007 B2
(45) Date of Patent: Jul. 11, 2023

(54) REPLAY SYSTEM AND METHOD OF SHIP COLLISION ACCIDENTS USING FREE RUNNING MODEL TEST

(71) Applicant: KOREA INSTITUTE OF OCEAN SCIENCE & TECHNOLOGY, Busan (KR)

(72) Inventors: Nam-Sun Son, Sejong-si (KR); Han-Sol Park, Ansan-si (KR); Chun-Seon Pyo, Daejeon (KR)

(73) Assignee: KOREA INSTITUTE OF OCEAN SCIENCE & TECHNOLOGY, Busan (KR)

( * ) Notice: Subject to any disclaimer, the term of this patent is extended or adjusted under 35 U.S.C. 154(b) by 0 days.

(21) Appl. No.: 18/060,959

(22) Filed: Dec. 1, 2022

(65) Prior Publication Data
US 2023/0177237 A1 Jun. 8, 2023

(30) Foreign Application Priority Data

Dec. 2, 2021 (KR) ........................ 10-2021-0171316

(51) Int. Cl.
*G06F 30/20* (2020.01)

(52) U.S. Cl.
CPC .................................... *G06F 30/20* (2020.01)

(58) Field of Classification Search
CPC ........................................................ G06F 30/20
USPC ............................................................. 703/8
See application file for complete search history.

(56) References Cited

U.S. PATENT DOCUMENTS

| 2004/0193347 | A1* | 9/2004 | Harumoto | ................ G08G 1/16 701/45 |
| 2017/0286575 | A1* | 10/2017 | Emond | ................... G06F 30/20 |
| 2018/0190129 | A1* | 7/2018 | Park | ........................ G08G 3/02 |

FOREIGN PATENT DOCUMENTS

| CN | 107607282 A | 1/2018 |
| JP | 2021-107785 A | 7/2021 |
| KR | 10-2008-0107757 A | 12/2008 |
| KR | 10-2011-0114077 A | 10/2011 |
| KR | 10-1187182 B1 | 9/2012 |
| KR | 10-2013-0071580 A | 7/2013 |
| KR | 10-2016-0129212 A | 11/2016 |
| KR | 10-1729464 B1 | 7/2017 |

(Continued)

OTHER PUBLICATIONS

"Development of replay system of ships' collision accident," 2017, pp. 1-119.

(Continued)

*Primary Examiner* — Andre Pierre Louis
(74) *Attorney, Agent, or Firm* — Lewis Roca Rothgerber Christie LLP

(57) ABSTRACT

Provided is a replay system of ship collision accidents using a free running model test including a ship collision replay simulation system configured to replay the ship collision accidents by receiving a navigation trajectory of the ship collision accidents; a free running model system configured to perform a free running model test of the collision accident ship using a free running model ship; and a free running control system configured to remotely perform the free running model test, in which the replay of the ship collision accidents is performed by simultaneously performing a simulation in the ship collision replay simulation system and a free running model test in the free running model system.

16 Claims, 8 Drawing Sheets

(56) References Cited

FOREIGN PATENT DOCUMENTS

KR        10-1987846 B1    6/2019
KR    10-2020-0100935 A    8/2020

OTHER PUBLICATIONS

Korean Notice of Office Action for Application No. KR 10-2021-0171316 dated Feb. 7, 2022 and English Translation, 17 pages.
Korean Notice of Allowance for Application No. KR 10-2021-0171316 dated Apr. 26, 2022 and English Translation, 2 pages.
Development of Replay System of Ships' Collision Accident, 2017.02. Part1, with English summary, 120 pages.
Japanese Office Action for Application No. 2022-192737, dated Jan. 24, 2023, 3 pages and English translation, 4 pages.

\* cited by examiner

REPLAY SYSTEM AND METHOD OF SHIP COLLISION ACCIDENTS USING FREE RUNNING MODEL TEST

CROSS-REFERENCE TO RELATED APPLICATIONS

This application claims the priority of Korean Patent Application No. 10-2021-0171316 filed on Dec. 2, 2021, in the Korean Intellectual Property Office, the disclosure of which is incorporated herein by reference.

BACKGROUND OF THE INVENTION

Field of the Invention

The present disclosure relates to replay system and method of ship collision accidents using a free running model test, and more particularly, to replay system and method of ship collision accidents using a free running model test capable of verifying a ship collision accident replay simulation in real time while replaying ship collision accidents in real time by replaying the ship collision accidents using a free running model test at the time of the ship collision accidents to perform avoidance evaluation through physical collision replay and physical avoidance maneuvers of the accident ship.

Description of the Related Art

Conventionally, when a ship is operating, a navigator performs a lookout task in preparation for collision accidents, and is supported through radar and electronic navigational chart equipment.

However, it takes a lot of time to identify a collision situation at an early stage, manually check lots of navigational equipment one by one until performing an avoidance maneuver, and quickly respond to a dangerous situation.

In addition, in a situation where 30% of marine accidents are ship collision accidents, and human error accounts for 80% or more of the ship collision accidents, in order to prevent collision accidents in advance, there is a need of a system capable of supporting a collision situation with dozens of ships around an own ship to be effectively identified in a short time.

Conventionally, there is a function to receive a collision risk between two specific ships manually set as an alarm by using a distance of closest point approach (DCPA) in ARPA radar, and the like, but through a combination of dozens of ships, the risk of collision is not considered at the same time.

For this reason, there was a limit in determining which group was the most dangerous among dozens of ships and which group had a high risk of collision.

Like the ship, there is no system that provides the risk of collision between combinations of many ships even in the case of a controller who performs a control task of ship traffic at a maritime traffic control center.

Recently, ship navigation support systems have been developed and distributed, but ship accidents have not been reduced, and as of 2017, 10% or more of 2600 accidents, 280 collision accidents have occurred, and based on reconciliation accidents, over the past five years, 60% or more of collision accidents have occurred and 80% or more of these accidents have occurred by navigational negligence.

The ship collision accidents may develop into large-scale marine pollution accidents, as can be seen from the Hebei Spirit accident, and it is difficult to maintain the collision site, so that there is a need for a replay system of ship collision accidents to analyze the mechanism and cause of the collision.

A replay system of ship collision accidents developed in the related art is a method of examining the causes of collision accidents by mainly inputting navigation information of ships, such as AIS, or accident ships stored in VTS, and plotting the navigation information on an electronic navigation chart to examine the trajectories, and there is a limitation in that it is difficult to accurately determine the physical behavior of a ship.

A method of applying marine environmental conditions using a simulation and performing avoidance evaluation such as avoidance maneuvers is also applied by assuming the same type of ship navigation model based on specification information of the accident ship, and there is a limitation in that it is impossible to accurately simulate the physical avoidance behavior according to the avoidance control of the ship during avoidance evaluation.

SUMMARY OF THE INVENTION

The present disclosure is derived to solve the problems in the related art as described above, and an object of the present disclosure is to provide replay system and method of ship collision accidents using a free running model test capable of verifying a ship collision accident replay simulation in real time while replaying ship collision accidents in real time by replaying the ship collision accidents using a free running model test at the time of the ship collision accidents to perform avoidance evaluation through physical collision replay and physical avoidance maneuvers of the accident ship.

According to an aspect of the present disclosure, there is provided a replay system of ship collision accidents using a free running model test including a ship collision replay simulation system configured to replay the ship collision accidents by receiving a navigation trajectory of the ship collision accidents; a free running model system configured to perform a free running model test of the collision accident ship using a free running model ship; and a free running control system configured to remotely perform the free running model test, in which the replay of the ship collision accidents is performed by simultaneously performing a simulation in the ship collision replay simulation system and a free running model test in the free running model system.

According to another aspect of the present disclosure, there is provided a replay system of ship collision accidents using a free running model test including a ship collision replay simulation system configured to replay the ship collision accidents by receiving a navigation trajectory of the ship collision accidents; a free running model system configured to perform a free running model test of the collision accident ship using a free running model ship; and a free running control system configured to remotely perform the free running model test, in which a propulsion and steering command of a full ship scale of the accident ship for path tracking is generated in order to replay the accident along a collision trajectory on the ship collision replay simulation system.

The propulsion and steering command scaled with the full ship scale of the accident ship may be converted into the propulsion and steering command scaled with the model ship scale through the free running control system to be applied to the free running model system.

According to the propulsion and steering command applied by the free running model system, the free running model ship may physically move at an outdoor test site or an indoor marine engineering tank test facility and acquire navigation information.

When the area in a marine engineering tank is 50 m×30 m and the test is enabled in the area in the marine engineering tank, a free running test in the tank may be performed, and an outdoor free running test may be performed out of the tank area.

Real-time navigation information (position, speed, bearing, and attitude information) of the free running model ship may be acquired through a GPS, a positioning sensor, and a gyro sensor installed on the free running model ship.

The acquired navigation information of the free running model ship may be transmitted as information scaled with the model ship scale of the free running control system remotely through wireless communication.

The navigation information transmitted as the information scaled with the model ship scale of the free running control system may be converted to information scaled with the full ship scale to be expressed as the navigation trajectory of the collision ship on the ship collision replay simulation system, so as to show and real-time verify the simulation trajectory results of the ship collision replay simulation system.

The information scaled with the model ship scale may be converted to the information scaled with the full ship scale by applying the Froude similarity transformation law according to a scale ratio defined as the length of the full ship scale to the length of the model ship scale.

In addition, the replay system of the ship collision accidents using the free running model test may implement a replay mode that replays ship collision accidents, and an avoidance mode that avoids collisions at the time of a collision accident.

In the avoidance mode, while following the trajectory of the ship collision accident, when a ship collision risk occurs before the time of the accident, a user may perform the avoidance evaluation by applying the propulsion and steering command for avoidance.

At this time, two free running model ships applied to the free running model system may be operable.

As another method, the free running model ship applied to the free running model system may be set as an own ship, and a counterpart ship as a virtual simulation ship may be set and operated in the ship collision replay simulation system.

In addition, according to navigation information of a virtual ship collision accident situation given by the ship collision replay simulation system, the free running model ship may perform a free running model test, and test information of the free running model ship of the own ship may be updated in the ship collision replay simulation system.

In addition, steering and propulsion command values for collision avoidance of the free running model ship of the own ship may be calculated manually or automatically, so that an avoidance test of the own ship is performed during the physical free running model test. When evaluating the avoidance of the counterpart ship, the own ship may be replayed as a free running test as it is in the accident situation, and the avoidance evaluation may be performed with a virtual simulation of the counterpart ship.

According to yet another aspect of the present disclosure, there is provided a replay method of ship collision accidents using a free running model test as a replay method of replaying ship collision accidents using the replay system of the ship collision accidents using the free running model test, including verifying a ship collision accident replay simulation in real time while replaying ship collision accidents in real time.

The specific details of other embodiments are included in the "the detailed description of the invention" and the accompanying "drawings".

Advantages and/or features of the present disclosure, and methods for achieving the advantages and/or features will be apparent with reference to embodiments to be described below in detail together with the accompanying drawings.

However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined only by the appended claims.

According to the solution for solving the problems, the present disclosure has the following effects.

According to the present disclosure, it is possible to acquire and replay not only the physical navigation trajectory but also the attitude and steering/propulsion control information, and to verify a conventional ship collision replay simulation in real time.

In addition, it is possible to separately evaluate whether avoidance is enabled through avoidance maneuvers at the time of the accident while replaying the collision accident as it is, and to acquire physical avoidance trajectory information capable of verifying the avoidance simulation when replaying the ship accidents.

It should be understood that the effects of the present disclosure are not limited to the effects, but include all effects that can be deduced from the detailed description of the present disclosure or configurations of the present disclosure described in appended claims.

DETAILED DESCRIPTION OF THE PREFERRED EMBODIMENT

Figure 1:
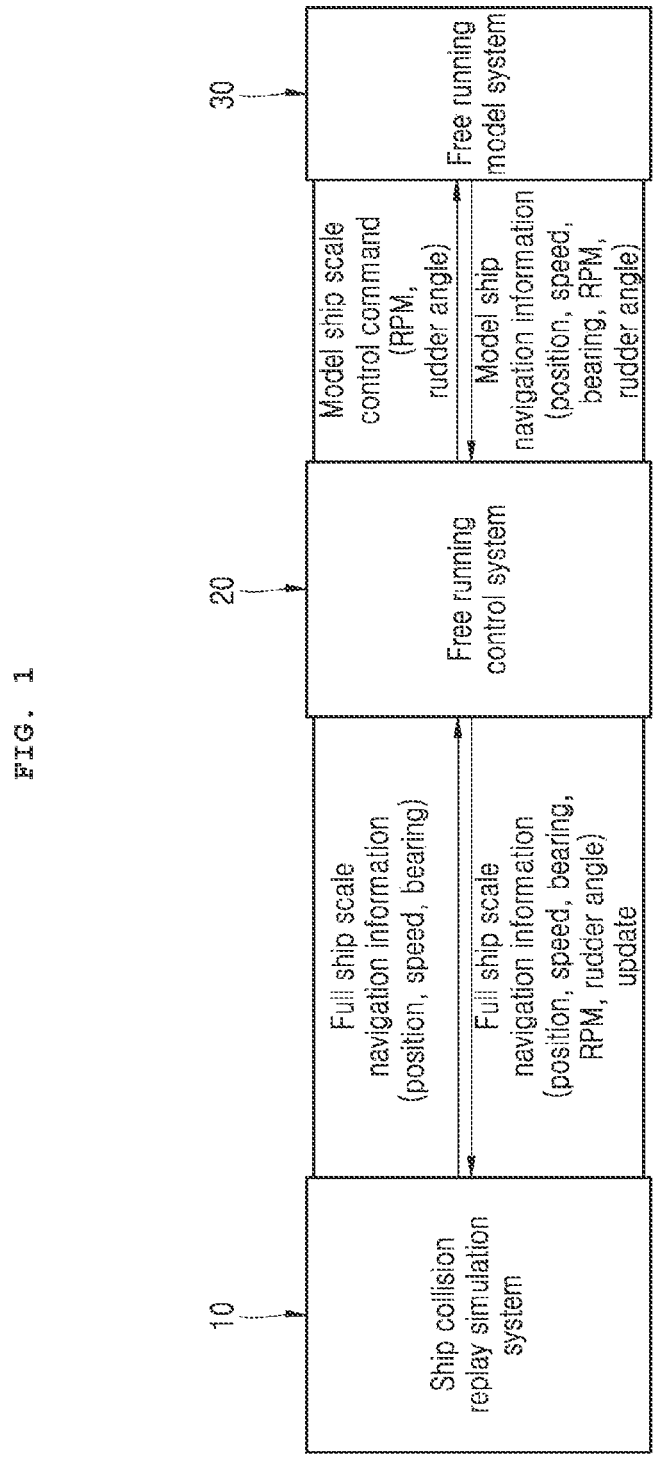
FIG. 1 is a diagram schematically illustrating a configuration of a replay system of ship collision accidents using a free running model test according to the present disclosure.

Hereinafter, preferred embodiments of the present disclosure will be described below in detail with reference to the accompanying drawings.

Before describing the present disclosure in detail, terms or words used in this specification should not be construed as unconditionally limited to a conventional or dictionary meaning, and the inventors of the present disclosure can appropriately define and use the concept of various terms in order to describe their invention in the best method. Furthermore, it should be understood that these terms or words should be interpreted as meanings and concepts consistent with the technical idea of the present disclosure.

That is, the terms used in the present disclosure are only used to describe a preferred embodiment of the present disclosure, and are not intended to specifically limit the contents of the present disclosure, and it should be noted that these terms are terms defined in consideration with various possibilities of the present disclosure.

In addition, in this specification, it should be understood that the singular expression may include a plural expression unless clearly indicated in another meaning in the context, and even if similarly expressed in the plural, the singular expression may include the meaning of the singular number.

Throughout the present disclosure, when a component is described as "including" the other component, the component does not exclude any other component, but may further include any other component unless otherwise indicated in contrary.

Furthermore, when it is described that a component is "present inside or connected into" the other component, this component may be directly connected or in contact with the other component, and may be spaced apart from the other component at a predetermined distance. In addition, when a component is spaced apart from the other component at a predetermined distance, a third component or means may exist to fix and connect the corresponding component to the other component and the description of the third component or means may also be omitted.

On the contrary, when it is described that a component is "directly connected to" or "directly accesses" the other component, it should be understood that a third component or means does not exist.

Similarly, other expressions describing a relationship between components, that is, expressions such as "between" and "directly between" or "adjacent to" and "directly adjacent to" should be similarly interpreted.

In addition, in the specification, the terms such as "one surface", "the other surface", "one side", "the other side", "first", "second", etc., are used to clearly distinguish one component from the other component with respect to one component.

In addition, in this specification, it should be understood that terms related to positions such as "upper", "lower", "left", and "right" are used to indicate relative positions with respect to the corresponding component in the drawing, and unless an absolute position is specified with respect to their positions, these position-related terms should not be construed as referring to an absolute position.

Moreover, in the specification of the present disclosure, terms such as "unit", "er/or", "module", "device", etc., mean a unit capable of processing one or more functions or operations when used, and it should be noted that the unit may be implemented in hardware or software, or a combination of hardware and software.

In addition, in this specification, in specifying the reference numerals for each component in each drawing, like reference numerals indicate like components throughout the specification, so that the same components have the same reference number even if it is shown in different drawings.

In the drawings appended to this specification, a size, a position, a coupling relationship, etc. of each component constituting the present disclosure may be described while being partially exaggerated, reduced, or omitted for sufficiently clearly delivering the spirit of the present disclosure or for the convenience of description, and thus, the proportion or scale thereof may not be exact.

Further, hereinafter, in the following description of the present disclosure, a detailed description of a configuration determined to unnecessarily obscure the subject matter of the present disclosure, for example, a known technology including the related art may also be omitted.

Figure 2:
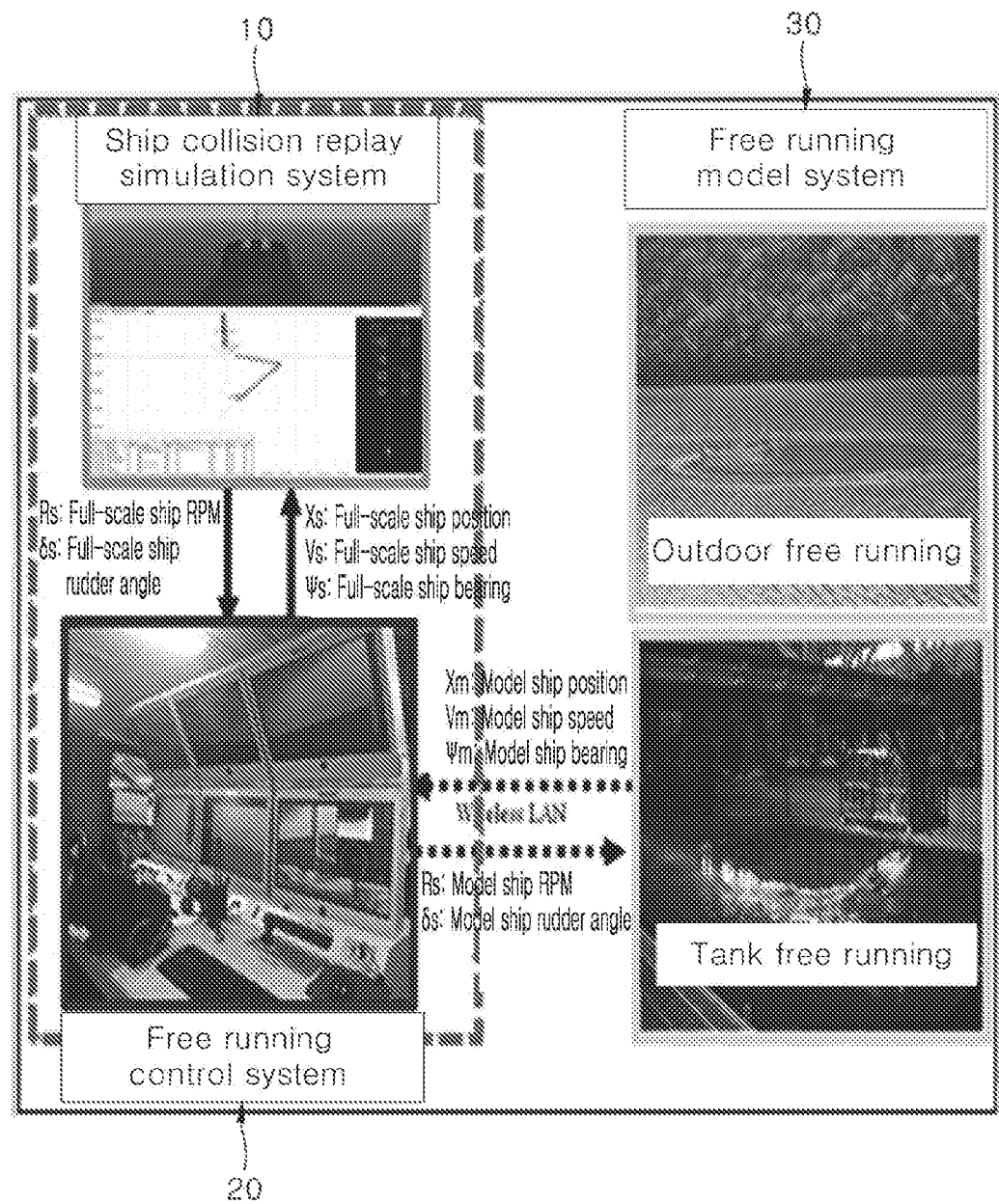
FIG. 2 is a diagram for describing real-time interworking of a ship collision replay simulation system, a free running control system, and a free running model system in the replay system of the ship collision accidents using the free running model test according to the present disclosure.

FIG. 1 is a diagram schematically illustrating a configuration of a replay system of ship collision accidents using a free running model test according to the present disclosure and FIG. 2 is a diagram for describing real-time interworking of a ship collision replay simulation system 10, a free running control system 20, and a free running model system 30 in the replay system of the ship collision accidents using the free running model test according to the present disclosure.

The replay system of the ship collision accidents using the free running model test according to the present disclosure is configured by a ship collision replay simulation system 10, a free running control system (10), and a free running model system 30 as illustrated in FIGS. 1 and 2, and the replay of the ship collision accidents is performed by simultaneously performing a simulation in the ship collision replay simulation system 10 and a free running model test in the free running model system 30.

The ship collision replay simulation system 10 replays the ship collision accidents by receiving a navigation trajectory of the ship collision accidents.

In order to replay the accident along a collision trajectory on the ship collision replay simulation system 10, a propulsion and steering command of a full ship scale of the accident ship for path tracking is generated to be transmitted to the free running control system 20 to be described below.

The free running control system 20 is to remotely perform the free running model test.

The propulsion and steering command scaled with the full ship scale of the accident ship generated in the ship collision replay simulation system 10 is converted into a propulsion and steering command scaled with the model ship scale through the free running control system 20 and applied to the free running model system 30 to be described below.

The free running model system 30 is to test the free running model of the collision accident ship using the free running model ship.

According to the propulsion and steering command applied by the free running model system 30, the free running model ship may physically move at an outdoor test site or an indoor marine engineering tank test facility and acquire navigation information.

Real-time navigation information (position, speed, bearing, and attitude information) of the free running model ship is acquired through a GPS, a positioning sensor, and a gyro sensor installed on the free running model ship.

In addition, the acquired navigation information of the free running model ship is transmitted as information scaled with the model ship scale of the free running control system 20 remotely through wireless communication.

As such, the navigation information transmitted as the information scaled with the model ship scale of the free running control system 20 is converted to information scaled with the full ship scale to be expressed as the navigation trajectory of the collision ship on the ship collision replay simulation system 10, thereby showing and real-time verifying the simulation trajectory results of the ship collision replay simulation system 10.

At this time, the information scaled with the model ship scale is converted to the information scaled with the full ship scale by applying the Froude similarity transformation law according to a scale ratio defined as the length of the full ship scale to the length of the model ship scale (see Equation 1).

[Equation 1] Full-scale ship-model ship transformation rule for navigation information and control information of free running model test Time: $t_1 = \sqrt{\lambda} t_m$
Length: $L_2 = \lambda L_m$
Position: $x_1 = \lambda x_m$, $y_s = \lambda y_m$
Angle: $\phi_s = \phi_m$, $\theta_s = \theta_m$, $\Psi_s = \Psi_m$, $\delta_s = \delta_m$
Speed: $U_s = \sqrt{\lambda} U_m$, $u_s = \sqrt{\lambda} u_m$ Angular rate: $\dot{\phi}_s = \dfrac{\dot{\phi}_m}{\sqrt{\lambda}}, \dot{\theta}_s = \dfrac{\dot{\theta}_m}{\sqrt{\lambda}}, \dot{\psi}_s = \dfrac{\dot{\psi}_m}{\sqrt{\lambda}}, \dot{\delta}_s = \dfrac{\dot{\delta}_m}{\sqrt{\lambda}}$ In Equation 1, $\lambda$ means a scale ratio, ts and tm mean times between a full-scale ship and a model ship, respectively, and Ls and Lm mean lengths of the full-scale ship and the model ship, respectively.

$\phi_s$, $\phi_m$ mean roll angles of the full-scale ship and the model ship, and $\theta_s$, $\theta_m$ mean pitch angles of the full-scale ship and the model ship.

$\Psi_s$, $\Psi_m$ mean yaw angles of the full-scale ship and the model ship, and $\delta_s$, $\delta_m$ mean rudder angles of the full-scale ship and the model ship.

Us and Um mean speeds of the full-scale ship and the model ship, and $u_s$, $u_m$ mean forward speeds of the full-scale ship and the model ship.

$\dot{\phi}_s$, $\dot{\phi}_m$ mean rall angular rates of the full-scale ship and the model ship, and $\dot{\theta}_s$, $\dot{\theta}_m$ mean pitch angular rates of the full-scale ship and the model ship.

$\dot{\Psi}_s$, $\dot{\Psi}_m$ mean yaw angular rates of the full-scale ship and the model ship, and $\dot{\delta}_s$, $\dot{\delta}_m$ mean rudder angular rates of the full-scale ship and the model ship.

In addition, the replay system of the ship collision accidents using the free running model test may implement a replay mode that replays ship collision accidents, and an avoidance mode that avoids collisions at the time of a collision accident.

In the avoidance mode, while following the trajectory of ship collision accident, when a ship collision risk occurs before the time of the accident, a user performs the avoidance evaluation by applying the propulsion and steering command for avoidance.

At this time, two free running model ships applied to the free running model system 30 can be operated.

As another method, the free running model ship applied to the free running model system 30 may be set as an own ship, and a counterpart ship as a virtual simulation ship may be set and operated in the ship collision replay simulation system 10.

In addition, according to navigation information of a virtual ship collision accident situation given by the ship collision replay simulation system 10, the free running model ship performs a free running model test, and test information of the free running model ship of the own ship is updated in the ship collision replay simulation system 10.

In addition, steering and propulsion command values for collision avoidance of the free running model ship of the own ship are calculated manually or automatically, so that an avoidance test of the own ship is performed during the physical free running model test. When evaluating the avoidance of the counterpart ship, the own ship is replayed as a free running test as it is in the accident situation, and the avoidance evaluation is performed with a virtual simulation of the counterpart ship.

Figure 3:
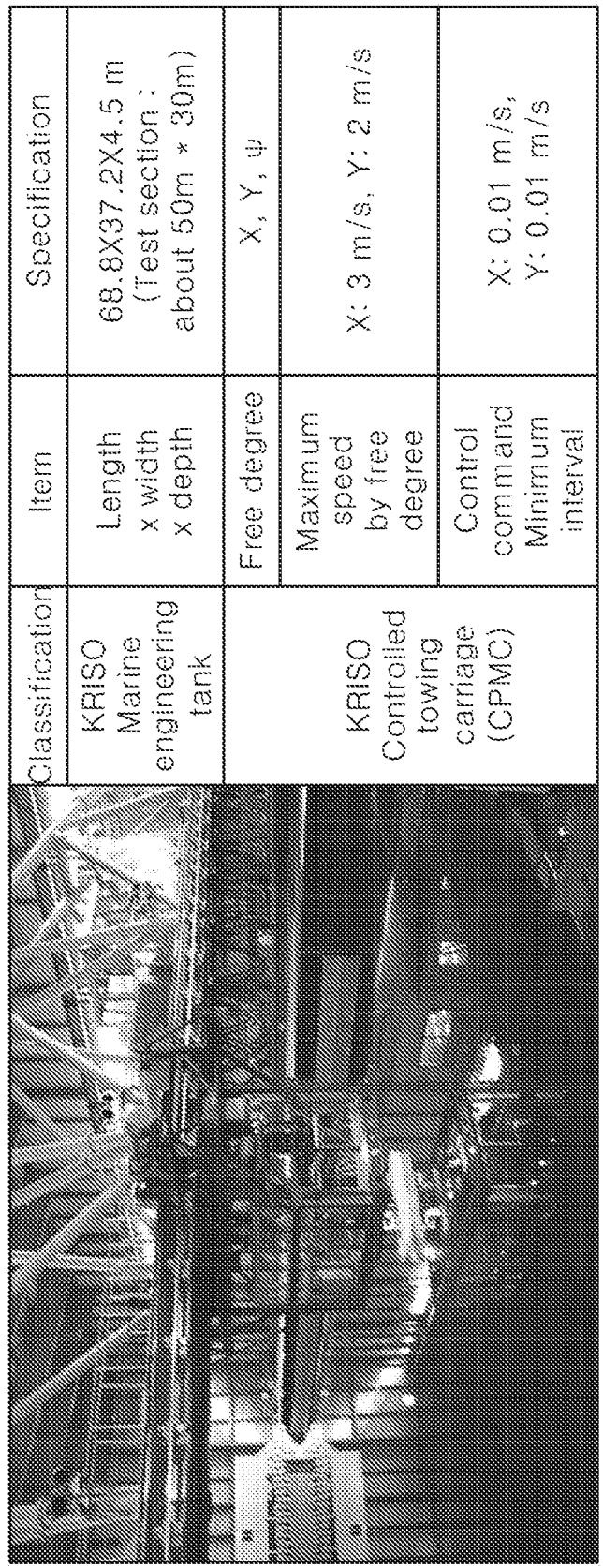
FIG. 3 is a drawing illustrating a tank and a towing carriage applied to the free running model system in the replay system of the ship collision accidents using the free running model test according to the present disclosure.

FIG. 3 is a drawing illustrating a tank and a towing carriage applied to the free running model system in the replay system of the ship collision accidents using the free running model test according to the present disclosure.

The free running model test performed by the free running model system is a certified test method, and a free running test method according to the International Towing carriage Conference (ITTC), an accredited organization, is applied.

In addition, the test is conducted in the presence of experts when conducting the free running model test.

As a test method according to an accident sea area according to the scale ratio conversion of two collision ships, when the area in the marine engineering tank is 50 m×30 m and the test is enabled in the area in the marine engineering tank, a free running test in the tank is performed, and an outdoor free running test is performed out of the tank area.

However, it is preferred to consider the influence of external force according to a method recommended by the International Maritime Organization (IMO).

Figure 4:
FIG. 4 is a drawing illustrating an example of a free running model ship applied to the free running model system in the replay system of the ship collision accidents using the free running model test according to the present disclosure.
Figure 5:
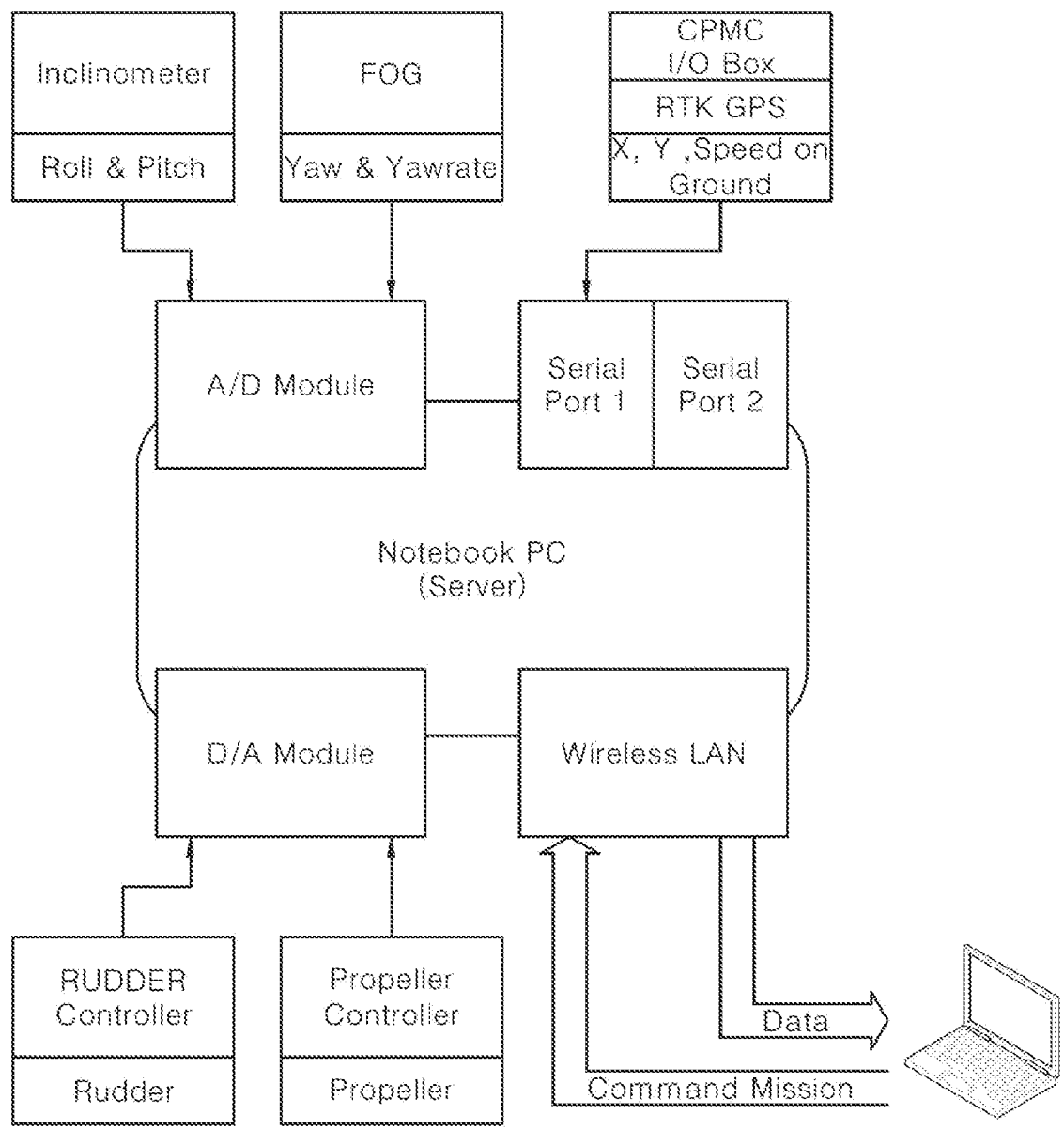
FIG. 5 is a drawing illustrating a configuration of the free running model system in the replay system of the ship collision accidents using the free running model test according to the present disclosure.

FIG. 4 is a drawing illustrating an example of a free running model ship applied to the free running model system in the replay system of the ship collision accidents using the free running model test according to the present disclosure and FIG. 5 is a drawing illustrating a configuration of the free running model system in the replay system of the ship collision accidents using the free running model test according to the present disclosure.

The free running model system according to the present disclosure is configured as follows.

(1) Free running test support facility for KRISO marine engineering tank/outdoor free running
   CPMC-based free running test system/outdoor free running control system (2) Free running test measurement device for KRISO marine engineering tank/outdoor free running
   CPMC-based model ship positioning system/precise positioning system for outdoor free running

[Table 1] Main specifications of free running model test device (KRISO)

| Classification | Item | Measured value or component (accuracy) |
| --- | --- | --- |
| Common | Fiber Optic Gyro (FOG) | Measurement of entrance angle (accuracy: 0.1° or less, drift 1°/hr or less) |
|  | Inclinometer | Heel angle, trim angle (resolution: 0.05°, °, degree: 0.1°) |
|  | Pressure Sensor, Pitot Tube | Fluid Velocimeter |

-continued

| Classification | Item | Measured value or component (accuracy) |
| --- | --- | --- |
| | Force transducer | Measurement of rudder force, torque, and impellent force |
| | Main processing device | Control communication computer, data acquisition device, communication device |
| Indoor | CPMC automatic tracking device | Position (X, Y), bearing (W), speed (V) |

(3) Free running model ship: Ship collision accident ship including rudder and propulsion device (propeller)

Figure 6:
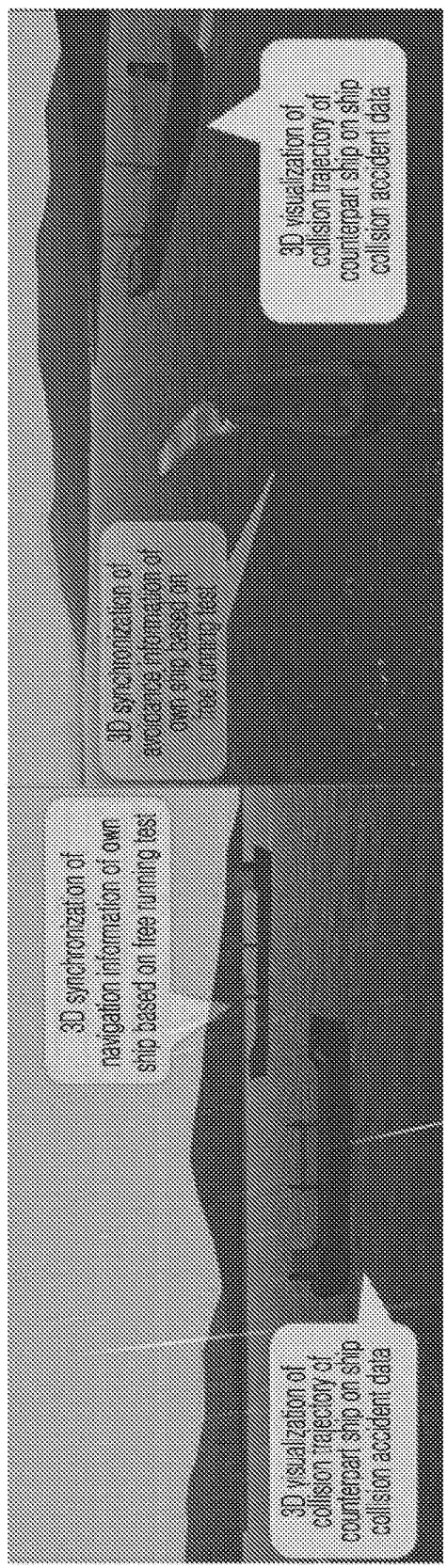
FIG. 6 is a conceptual diagram for evaluation of collision risk and avoidability in the replay system of the ship collision accidents using the free running model test according to the present disclosure.
Figure 7:
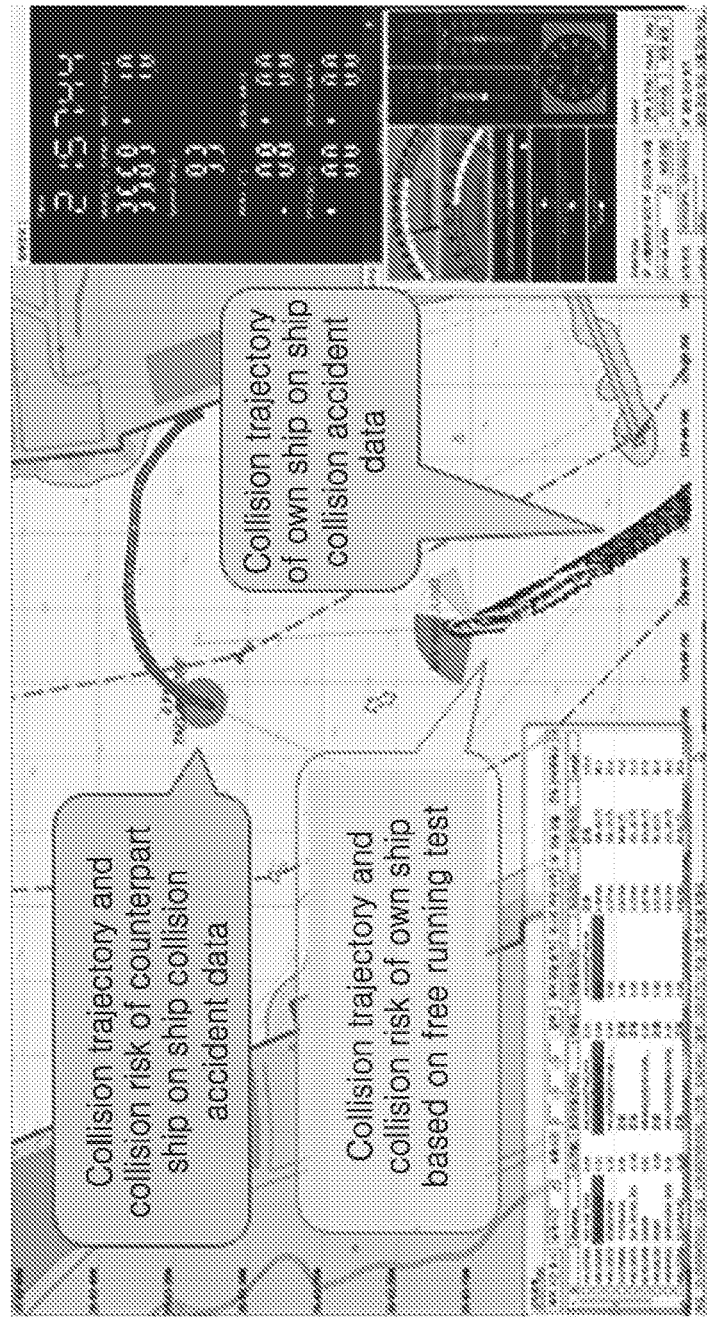
FIG. 7 is a diagram illustrating an example in which a collision risk evaluation function is implemented by the replay system of the ship collision accidents using the free running model test according to the present disclosure.
Figure 8:
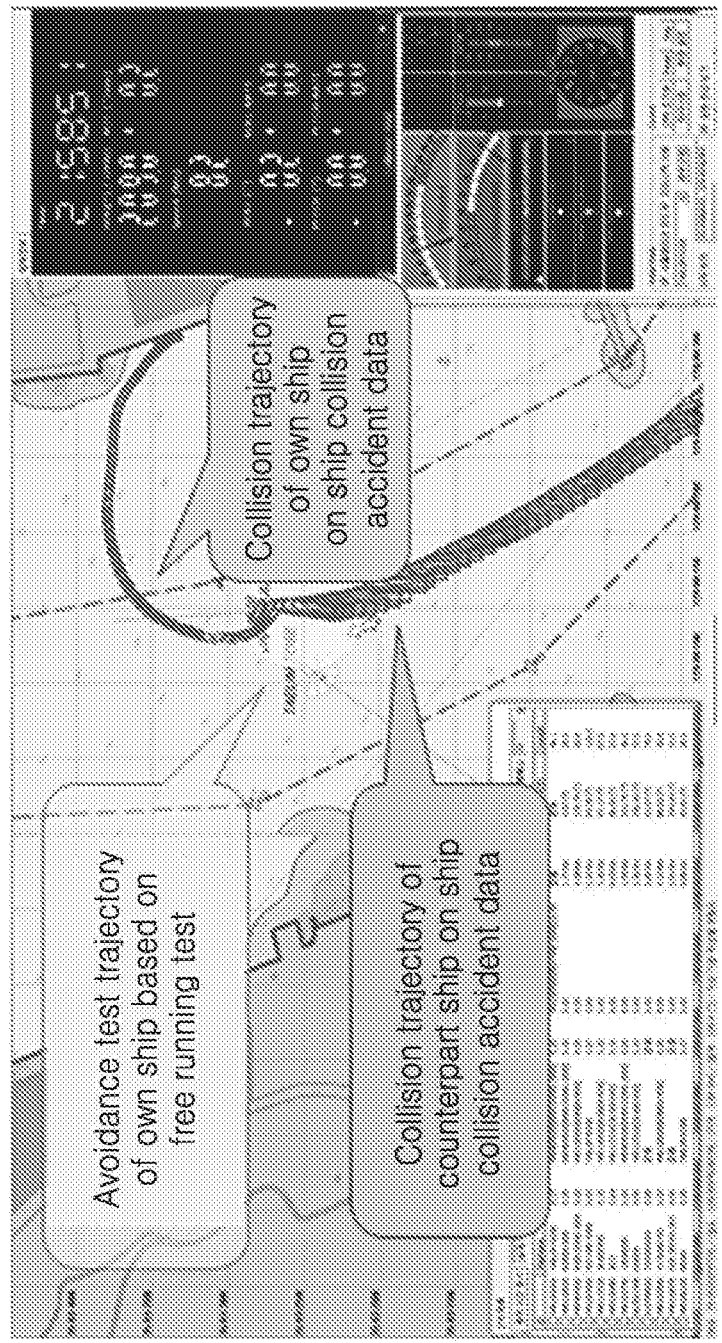
FIG. 8 is a diagram illustrating an example in which an avoidability evaluation function is implemented by the replay system of the ship collision accidents using the free running model test according to the present disclosure.

(4) Free running model system sensor: Positioning sensor for measuring position, speed, and bearing of free running model ship (5) Free running model system controller: Motor controller for propulsion/steering of free running model ship FIG. 6 is a conceptual diagram for evaluation of collision risk and avoidability in the replay system of the ship collision accidents using the free running model test according to the present disclosure, FIG. 7 is a diagram illustrating an example in which a collision risk evaluation function is implemented by the replay system of the ship collision accidents using the free running model test according to the present disclosure, and FIG. 8 is a diagram illustrating an example in which an avoidability evaluation function is implemented by the replay system of the ship collision accidents using the free running model test according to the present disclosure.

An own ship physically means a free running model ship, and also exists virtually at the same time.

According to the navigation information of ship collision accidents given on the virtual ship collision replay simulation system, a physical free running model test is performed at the same time, and the model test information of the own ship is updated in the ship collision replay simulation system.

The steering/propulsion command value for collision avoidance of the own ship is calculated manually or automatically, and the avoidance test of the own ship is performed during the physical free running model test using the steering/propulsion command value.

However, during the avoidance evaluation of the counterpart ship, the own ship is replayed by the free navigation test as it is in the accident situation, and the avoidance evaluation is performed on the counterpart ship by a virtual simulation.

The real-time collision risk (avoidability) is evaluated based on the navigation (avoidance) trajectory updated as a result of the free running model test of the own ship and the navigation information with the virtual counterpart ship.

Therefore, the replay performance (avoidability) of the collision replay system is experimentally verified by comparing the collision accident replay data of the own ship and the navigation trajectory (avoidance trajectory) on the physical free running model test.

As described above, although several preferred embodiments of the present disclosure have been described with some examples, the descriptions of various exemplary embodiments described in the "detailed description for implementing the Invention" item are merely exemplary, and it will be appreciated by those skilled in the art that the present disclosure can be variously modified and carried out or equivalent executions to the present disclosure can be performed from the above description.

In addition, since the present disclosure can be implemented in various other forms, the present disclosure is not limited by the above description, and the above description is for the purpose of completing the disclosure of the present disclosure, and the above description is just provided to completely inform those skilled in the art of the scope of the present disclosure, and it should be known that the present disclosure is only defined by each of the claims.

What is claimed is:

1. A replay system of ship collision accidents using a free running model test comprising:
    a ship collision replay simulation system configured to replay ship collision accidents by receiving a navigation trajectory of the ship collision accidents;
    a free running model system configured to perform a free running model test of the collision accident ship using a free running model ship; and
    a free running control system configured to remotely perform the free running model test,
    wherein real-time navigation information of the free running model ship is transmitted as information scaled with the model ship scale of the free running control system and the transmitted information scaled with the model ship scale is converted to information scaled with the full ship scale to be expressed as the navigation trajectory of the collision ship on the ship collision replay simulation system, and
    the replay of the ship collision accidents is performed by simultaneously performing a simulation in the ship collision replay simulation system and a free running model test in the free running model system.

2. A replay method of ship collision accidents using a free running model test as a replay method of replaying ship collision accidents using the replay system of the ship collision accidents using the free running model test according to claim 1, the replay method comprising:
    verifying a ship collision accident replay simulation in real time while replaying ship collision accidents in real time.

3. A replay system of ship collision accidents using a free running model test comprising:
    a ship collision replay simulation system configured to replay ship collision accidents by receiving a navigation trajectory of the ship collision accidents;
    a free running model system configured to perform a free running model test of the collision accident ship using a free running model ship; and
    a free running control system configured to remotely perform the free running model test,
    wherein a propulsion and steering command of a full ship scale of the accident ship for path tracking is generated in order to replay the accident along a collision trajectory on the ship collision replay simulation system, and
    real-time navigation information of the free running model ship is transmitted as information scaled with the model ship scale of the free running control system and the transmitted information scaled with the model ship scale is converted to information scaled with the full ship scale to be expressed as the navigation trajectory of the collision ship on the ship collision replay simulation system.

4. The replay system of the ship collision accidents using the free running model test of claim 3, wherein the propulsion and steering command scaled with the full ship scale of the accident ship is converted into a propulsion and steering command scaled with the model ship scale through the free running control system to be applied to the free running model system.

5. The replay system of the ship collision accidents using the free running model test of claim 4, wherein according to the propulsion and steering command applied by the free running model system, the free running model ship physically moves at an outdoor test site or an indoor marine engineering tank test facility and acquires navigation information.

6. The replay system of the ship collision accidents using the free running model test of claim 5, wherein when the area in a marine engineering tank is 50 m×30 m and the test is enabled in the area in the marine engineering tank, a free running test in the tank is performed, and an outdoor free running test is performed out of the tank area.

7. The replay system of the ship collision accidents using the free running model test of claim 5, wherein real-time navigation information (position, speed, bearing, and attitude information) of the free running model ship is acquired through a GPS, a positioning sensor, and a gyro sensor installed on the free running model ship.

8. The replay system of the ship collision accidents using the free running model test of claim 7, wherein the acquired navigation information of the free running model ship is transmitted as information scaled with the model ship scale of the free running control system remotely through wireless communication.

9. The replay system of the ship collision accidents using the free running model test of claim 8, wherein the navigation information transmitted as the information scaled with the model ship scale of the free running control system is converted to information scaled with the full ship scale to be expressed as the navigation trajectory of the collision ship on the ship collision replay simulation system, so as to show and real-time verify the simulation trajectory results of the ship collision replay simulation system.

10. The replay system of the ship collision accidents using the free running model test of claim 9, wherein the information scaled with the model ship scale is converted to the information scaled with the full ship scale by applying the Froude similarity transformation law according to a scale ratio defined as the length of the full ship scale to the length of the model ship scale.

11. The replay system of the ship collision accidents using the free running model test of claim 3, wherein the replay system of the ship collision accidents using the free running model test implements a replay mode that replays ship collision accidents, and an avoidance mode that avoids collisions at the time of a collision accident.

12. The replay system of the ship collision accidents using the free running model test of claim 11, wherein in the avoidance mode, while following the trajectory of the ship collision accident, when a ship collision risk occurs before the time of the accident, a user performs the avoidance evaluation by applying the propulsion and steering command for avoidance.

13. The replay system of the ship collision accidents using the free running model test of claim 3, wherein two free running model ships applied to the free running model system are operable.

14. The replay system of the ship collision accidents using the free running model test of claim 3, wherein the free running model ship applied to the free running model system is set as an own ship, and a counterpart ship as a virtual simulation ship is set and operated in the ship collision replay simulation system.

15. The replay system of the ship collision accidents using the free running model test of claim 14, wherein according to navigation information of a virtual ship collision accident situation given by the ship collision replay simulation system, the free running model ship performs the free running model test, and test information of the free running model ship of the own ship is updated in the ship collision replay simulation system.

16. The replay system of the ship collision accidents using the free running model test of claim 15, wherein steering and propulsion command values for collision avoidance of the free running model ship of the own ship are calculated manually or automatically, so that an avoidance test of the own ship is performed during the physical free running model test,
    when evaluating the avoidance of the counterpart ship, the own ship is replayed as a free running test as it is in the accident situation, and
    the avoidance evaluation is performed with a virtual simulation of the counterpart ship.

* * * * *